US010727822B2

(12) United States Patent
Fan

(10) Patent No.: US 10,727,822 B2
(45) Date of Patent: Jul. 28, 2020

(54) COMPARATOR AND RELAXATION OSCILLATOR

(71) Applicant: ALL WINNER TECHNOLOGY CO., LTD., Zhuhai (CN)

(72) Inventor: Suyan Fan, Guangdong (CN)

(73) Assignee: ALLWINNER TECHNOLOGY CO., LTD., Zhuhai (CN)

( * ) Notice: Subject to any disclaimer, the term of this patent is extended or adjusted under 35 U.S.C. 154(b) by 0 days.

(21) Appl. No.: 16/318,888

(22) PCT Filed: Dec. 13, 2016

(86) PCT No.: PCT/CN2016/109573
§ 371 (c)(1),
(2) Date: Jan. 18, 2019

(87) PCT Pub. No.: WO2018/014493
PCT Pub. Date: Jan. 25, 2018

(65) Prior Publication Data
US 2019/0190503 A1     Jun. 20, 2019

(30) Foreign Application Priority Data

Jul. 20, 2016 (CN) .......................... 2016 1 0575662

(51) Int. Cl.
*H03K 3/0231* (2006.01)
*H03K 3/012* (2006.01)
(Continued)

(52) U.S. Cl.
CPC .............. *H03K 4/50* (2013.01); *H03K 3/012* (2013.01); *H03K 3/0231* (2013.01); *H03K 5/2472* (2013.01)

(58) Field of Classification Search
CPC ........ H03K 3/012; H03K 3/0231; H03K 4/12; H03K 4/50; H03K 5/24; H03K 5/2472
(Continued)

(56) References Cited

U.S. PATENT DOCUMENTS 4,623,851 A * 11/1986 Abou ............... H03K 3/0231
                                                   331/111
5,434,545 A *  7/1995 Burchfield ............... H03B 5/24
                                                   327/101
(Continued)

FOREIGN PATENT DOCUMENTS

CN        101207771       6/2008
CN        101257289       9/2008
(Continued)

OTHER PUBLICATIONS

Search Report dated Feb. 5, 2020 issued in European Patent Application No. 16909420.8.
(Continued)

*Primary Examiner* — Levi Gannon
(74) *Attorney, Agent, or Firm* — Cozen O'Connor

(57) ABSTRACT

The invention provides a comparator and a relaxation oscillator. The comparator comprises a comparator circuit. The comparator circuit comprises a current mode comparator circuit. The current mode comparator circuit comprises a first current mode comparison circuit and a second current mode comparison circuit. Both the first current mode comparison circuit and the second current mode comparison circuit are electrically connected with a first input end and a second input end of the comparator circuit; the first current mode comparison circuit comprises two N-type MOS transistors; gate electrodes of the two N-type MOS transistors are electrically connected with each other; the second current mode comparison circuit comprises two P-type MOS transistors; and gate electrodes of the two P-type MOS transistors
(Continued)

transistors are electrically connected with each other. The oscillator comprises the comparator.

8 Claims, 4 Drawing Sheets

(51) Int. Cl.
*H03K 4/50* (2006.01)
*H03K 5/24* (2006.01)

(58) Field of Classification Search
USPC .................................................. 331/111, 143
See application file for complete search history.

(56) References Cited

U.S. PATENT DOCUMENTS

| | | | | |
|---|---|---|---|---|
| 6,307,415 | B1* | 10/2001 | Phillips | G04F 1/005 |
| | | | | 327/205 |
| 8,093,955 | B2* | 1/2012 | Ying | H02M 1/44 |
| | | | | 331/111 |
| 2007/0103243 | A1* | 5/2007 | Gong | H03K 3/0231 |
| | | | | 331/111 |
| 2012/0056863 | A1* | 3/2012 | Watanabe | H03K 3/0231 |
| | | | | 345/211 |
| 2013/0200924 | A1 | 8/2013 | Hsiao | |
| 2014/0028408 | A1* | 1/2014 | Wang | H03K 3/02315 |
| | | | | 331/144 |
| 2014/0210564 | A1* | 7/2014 | Sinha | H03K 3/0231 |
| | | | | 331/111 |

FOREIGN PATENT DOCUMENTS

| | | |
|---|---|---|
| CN | 101741254 | 6/2010 |
| CN | 103338026 | 10/2013 |
| CN | 103378830 | 10/2013 |
| CN | 103618525 | 3/2014 |
| CN | 203595959 | 5/2014 |
| CN | 103248340 | 10/2014 |
| CN | 104124921 | 10/2014 |
| CN | 106160703 | 11/2016 |
| CN | 106209027 | 12/2016 |

OTHER PUBLICATIONS

Chiang, Yu-Hsuan et al., "A Submicrowatt 1.1-MHz CMOS Relaxation Oscillator with Temperature Compensation", IEEE Transactions on Circuits and Systems II: Express Briefs, Dec. 1, 2013, vol. 60, No. 12, pp. 837-841.

Klapf, C. et al., "Analyses and Design of Low Power Clock Generators for RFID TAGs", Research in Microelectronics and Electronics, Jun. 22, 2008, pp. 181-184.

Xu, Li et al., "A Low-Power Temperature-Compensated Relaxation Oscillator for Built-In Test Signal Generation", 2015 IEEE 58th International Midwest Symposium on Circuits and Systems, Aug. 2, 2015, pp. 1-4.

* cited by examiner

COMPARATOR AND RELAXATION OSCILLATOR

PRIORITY CLAIM

This is a U.S. national stage of application No. PCT/CN2016/109573, filed on Dec. 13, 2016. Priority is claimed on Chinese Application No.: 201610575662.0, filed Jul. 20, 2016, the content of which is incorporated herein by reference.

TECHNICAL FIELD

The invention belongs to the field of comparator, and particularly relates to comparator and relaxation oscillator. This invention is based on Chinese Invention Patent Application No. 201610575662.0, filed on Jul. 20, 2016, the contents of which are incorporated herein by reference as documents closely relevant to this invention.

BACKGROUND ART

All single-chip integrated circuit devices that require clock signals require a clock source to provide the clock signals. The mainstream clock sources have an off-chip crystal oscillator, an on-chip harmonic oscillator, an on-chip ring oscillator and an on-chip relaxation oscillator. The crystal oscillator is widely used due to its favorable frequency accuracy and stability. With the development of Internet-of-Things devices, wearable devices and medical implantable devices, the market's demand for the integratability of electronic devices is higher and higher, the requirement on power dissipation control is increasingly rigorous, and the desire for cost reduction is stronger and stronger. Hence, the performance of an on-chip integratable oscillator needs to be improved substantially to replace the crystal oscillator and to meet the increasingly higher market demand. The relaxation oscillator is widely used and studied for its low power dissipation, easiness in frequency control and simple structure.

Technical Problem

The Chinese invention patent application (publication No.: CN104124921A) discloses an invention titled as "current mode comparator based low voltage and low power consumption CMOS relaxation oscillator and method". This relaxation oscillator uses two capacitors, so that the influence on the frequency stability from delayed time of capacitor discharging is avoided. However, the area of a circuit layout of the capacitor is doubled, leading to increased cost. Meanwhile, threshold voltage of an input end of an SR latch exists offset and is liable to be affected by the temperature, so the frequency accuracy and stability will become worse once the offset voltage or temperature change causes higher threshold voltage. In addition, one capacitor is charged and the other capacitor is discharged every half cycle during the oscillation alternately. When one certain capacitor is discharged, a charging current source remains providing current. As a result, the current consumed on the capacitor by an oscillating main circuit is twice the capacitor charging current at any time, leading to a low current utilization rate and high power dissipation.

In addition, the Chinese invention patent application (publication No.: CN103338026A) discloses an invention titled as "relaxation oscillator". In order to improve the frequency stability against the temperature, this oscillator adopts a P-type polycrystalline resistor and an N-type polycrystalline resistor which are complementary in temperature coefficient, wherein the unit resistance value of the N-type polycrystalline resistor is relatively low, and the area occupied by the resistor in a circuit layout is increased, leading to increased cost. In order to eliminate offset voltage of the comparator and the current mode comparator, this oscillator designs a more complex comparator structure and a switch switching unit. Meanwhile, a more complex clock generator is designed to cooperate in controlling the switching unit, which increases the circuit complexity and prolongs a development cycle. At the same time, when the voltage signal passes through the comparator and the clock generator, a loop delay is relatively long, leading to that a long non-ideal delay liable to the influence of the temperature and voltage is added to the cycle, thereby resulting in that the frequency stability is limited. Furthermore, the comparator needs to provide voltage for the comparator by virtue of an operational amplifier, and in order to obtain good performance, the comparator needs to consume static current, thus resulting in higher power dissipation of an oscillating circuit. In addition, when oscillating, the oscillator will charge the capacitor once every half cycle, then discharge immediately, and then charge for the second half cycle. Hence, current consumed on the capacitor by a main circuit of the oscillator is twice the capacitor charging current at any time, leading to a relatively low current utilization rate.

Technical Solution

A main object of this invention is to provide a comparator which is simple in structure and lower in power dissipation.

Another object of this invention is to provide a relaxation oscillator capable of lowering the production cost, shortening a development cycle, improving the frequency stability and achieving super-low power dissipation.

To realize the main object above, the comparator provided by the invention comprises a comparator circuit; the comparator circuit comprises a current mode comparator circuit; the current mode comparator circuit comprises a first current mode comparison circuit and a second current mode comparison circuit; both the first current mode comparison circuit and the second current mode comparison circuit are electrically connected with a first input end and a second input end of the comparator circuit; the first current mode comparison circuit comprises two N-type MOS transistors; gate electrodes of the two N-type MOS transistors are electrically connected with each other; the second current mode comparison circuit comprises two P-type MOS transistors; and gate electrodes of the two P-type MOS transistors are electrically connected with each other.

In one embodiment, the comparator circuit further comprises a phase inverter circuit; the current mode comparator circuits transmit voltage signals to the phase inverter circuit; the phase inverter circuit comprises a first phase inverter and a second phase inverter; the first phase inverter is connected with the second phase inverter in series; and an output end of the first current mode comparison circuit and an output end of the second current mode comparison circuit are electrically connected with an input end of the first phase inverter respectively.

In another embodiment, the comparator circuit further comprises a voltage comparison circuit; the first current mode comparison circuit or the second current mode comparison circuit inputs a first voltage signal to a reverse-phase input end of the voltage comparison circuit; and the first current mode comparison circuit or the second current mode comparison circuit inputs a second voltage signal to an in-phase input end of the voltage comparison circuit.

It thus can be seen that a circuit development cycle can be shortened by using the conventional voltage comparison circuit in the comparator circuit.

To realize the another object above, the relaxation oscillator provided by the invention comprises a relaxation oscillating circuit; the relaxation oscillating circuit comprises a comparator; the comparator comprises a comparator circuit; the comparator circuit comprises a current mode comparator circuit; the current mode comparison circuit comprises a first current mode comparison circuit and a second current mode comparison circuit; both the first current mode comparison circuit and the second current mode comparison circuit are electrically connected with a first input end and a second input end of the comparator circuit; the first current mode comparison circuit comprises two N-type MOS transistors; gate electrodes of the two N-type MOS transistors are electrically connected with each other; the second current mode comparison circuit comprises two P-type MOS transistors; and gate electrodes of the two P-type MOS transistors are electrically connected with each other.

It can be seen from the embodiment above that the relaxation oscillator of the invention uses the comparator which is simple in structure and low in power dissipation, so that the relaxation oscillator capable of lowering the production cost, shortening the development cycle, and achieving super-low power dissipation is realized.

In one embodiment, the comparator circuit further comprises a phase inverter circuit; the current mode comparator circuits transmit voltage signals to the phase inverter circuit; the phase inverter circuit comprises a first phase inverter and a second phase inverter; the first phase inverter is connected with the second phase inverter in series; and an output end of the first current mode comparison circuit and an output end of the second current mode comparison circuit are electrically connected with an input end of the first phase inverter respectively.

It can be seen from the embodiment above that the phase inverter circuit can generate a quantized voltage signal according to output voltage of a current mode comparator circuit to control a charging process and a discharging process of the capacitor.

In another embodiment, the comparator circuit further comprises a voltage comparison circuit; the first current mode comparison circuit or the second current mode comparison circuit outputs a first voltage signal to a reverse-phase input end of the voltage comparison circuit; and the first current mode comparison circuit or the second current mode comparison circuit outputs a second voltage signal to a normal-phase input end of the voltage comparison circuit.

It thus can be seen that an oscillating circuit is easier to realize by connecting a common voltage comparison circuit into the output end of the current mode comparator circuit.

In a further embodiment, the relaxation oscillating circuit further comprises a threshold voltage generation circuit and a capacitance charging and discharging circuit; the threshold voltage generation circuit inputs a threshold voltage signal to a first input end of the comparator circuit; and the capacitance charging and discharging circuit inputs a capacitance voltage signal to a second input end of the voltage comparison circuit.

It thus can be seen that the relaxation oscillator of the invention compares voltage of a reference end of a threshold resistor and voltage of a reference end of the capacitor through the comparator, and outputs control voltage to control the charging progress and the discharging progress of the capacitor.

In a further embodiment, the threshold voltage generation circuit comprises a first current source, a second current source and a threshold resistor; the first current source is electrically connected with the threshold resistor through a first switch element; the second current source is electrically connected with the threshold resistor through a second switch element; the capacitance charging and discharging circuit comprises a third current source, a fourth current source and a capacitor; the third current source is electrically connected with the capacitor through a third switch element; and the fourth current source is electrically connected with the capacitor through a fourth switch element.

It thus can be seen that the threshold voltage generation circuit and the capacitance charging and discharging circuit are each provided with two current sources, so that there are current sources working in the charging process and the discharging process of the capacitor.

In a further embodiment, the first switch element, the second switch element, the third switch element and the fourth switch element are electrically connected with an output end of the voltage comparison circuit respectively; the output end of the voltage comparison circuit is electrically connected with a branch circuit between the threshold resistor and the capacitor; the first current source and the third current source are electrically connected with a power cord respectively; and the second current source and the fourth current source are electrically connected with a ground wire respectively.

In a preferred embodiment, the first current source, the second current source, the third current source and the fourth current source each comprise one MOS transistor; the MOS transistor of the first current source is in common-gate connection with the MOS transistor of the third current source; and the MOS transistor of the second current source is in common-gate connection with the MOS transistor of the fourth current source.

It can be seen from the embodiment above that these relatively simple current sources are applicable to this invention so that the complexity of this invention is lowered.

Beneficial Effects

The invention has the advantages that the relaxation oscillator of the invention is capable of lowering the production cost, shortening the development cycle, improving the frequency stability and achieving super-low power dissipation.

The invention will be further described in combination with accompanying drawings and embodiments.

DETAILED DESCRIPTION OF THE INVENTION

A relaxation oscillator of the invention is based on a bootstrap technique. The invention is applicable to the design of oscillators as well as the design of monolithically integrated chips.

Embodiment 1 of the Relaxation Oscillator

Figure 1:
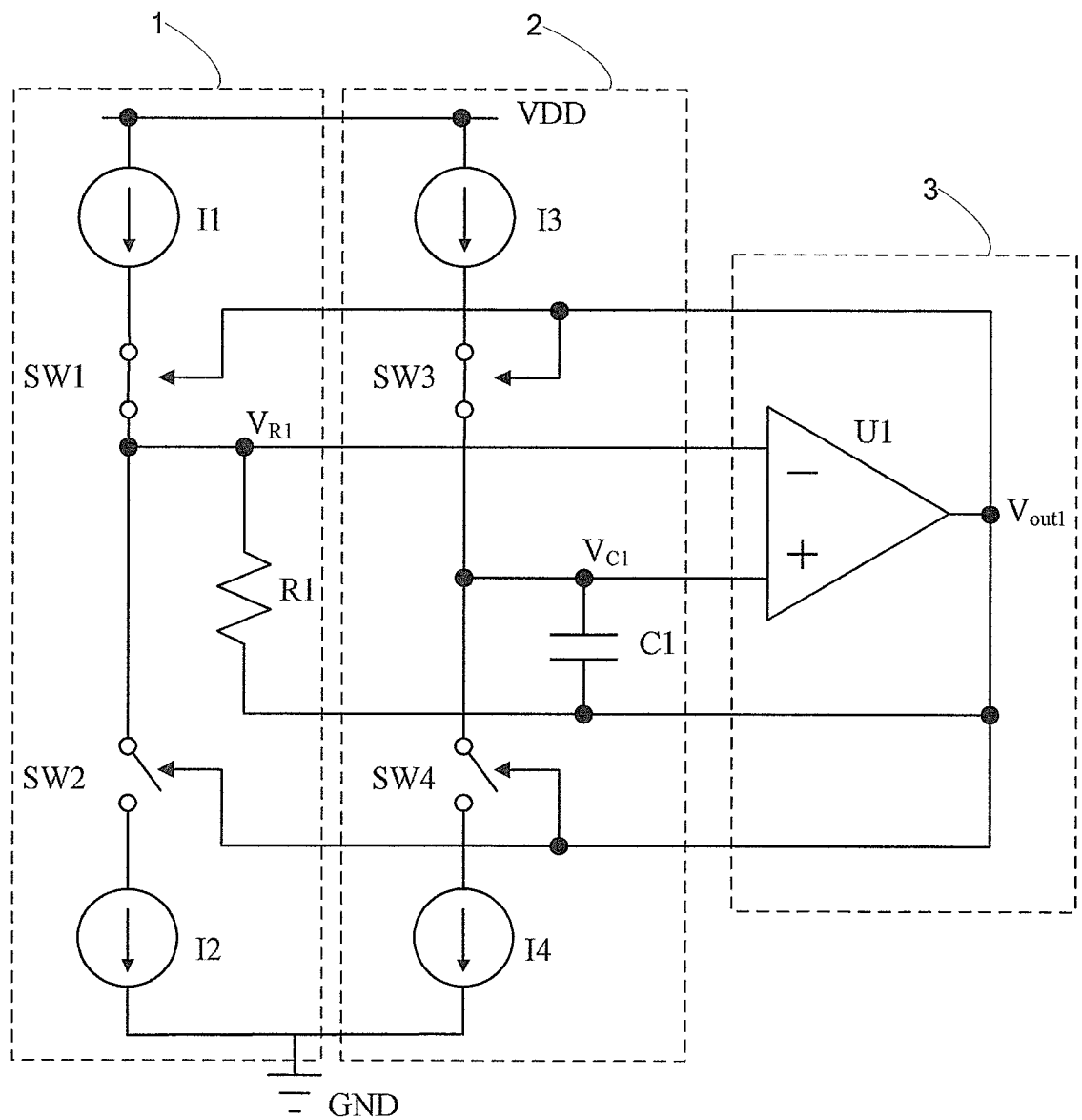
FIG. 1 is an electrical schematic diagram of Embodiment 1 of a relaxation oscillator of the invention.

As shown in FIG. 1, FIG. 1 is an electrical schematic diagram of the relaxation oscillator of the invention. It can be seen from FIG. 1 that the relaxation oscillating circuit of the relaxation oscillator comprises a threshold voltage generation circuit 1, a capacitance charging and discharging circuit 2 and a comparator circuit 3; the threshold voltage generation circuit 1 outputs a threshold voltage signal to a reverse-phase input end of the comparator circuit 3; the capacitance charging and discharging circuit 2 outputs a capacitance voltage signal to an in-phase input end of the comparator circuit 3. The threshold voltage generation circuit 1 comprises a first current source I1, a second current source I2 and a threshold resistor R1; the first current source I1 applies current to the threshold resistor R1 through a first reverse-phase switch element SW1 (that is, the current flows to the threshold resistor R1 from the first current source I1 via the first reverse-phase switch element SW1); the second current source I2 extracts current from the threshold resistor R1 through a first in-phase switch element SW2 (that is, the current flows to the second current source I2 from the threshold resistor R1 via the first in-phase switch element SW2). The capacitance charging and discharging circuit 2 comprises a third current source I3, a fourth current source I4 and a capacitor C1; the third current source I3 applies current to the capacitor C1 through a second reverse-phase switch element SW3 (that is, the current flows to the capacitor C1 from the third current source I3 via the second reverse-phase switch element SW3); the fourth current source I4 extracts current from the capacitor C1 through a second in-phase switch element SW4 (that is, the current flows to the fourth current source I4 from the capacitor C1 via the second in-phase switch element SW4); wherein the first current source I1 and the third current source I3 are electrically connected with a power cord VDD respectively; the second current source I2 and the fourth current source I4 are electrically connected with a ground wire GND respectively; and the first reverse-phase switch element SW1, the first in-phase switch element SW2, the second reverse-phase switch element SW3 and the second in-phase switch element SW4 are electrically connected with an output end of the comparator circuit 3 respectively and receive an output end voltage feedback signal. In addition, the output end of the comparator circuit 3 is electrically connected with a branch circuit between the threshold resistor R1 and the capacitor C1.

The threshold voltage generation circuit 1 is provided with the first current source I1, the second current source I2, the threshold resistor R1, as well as the first reverse-phase switch element SW1 and the first in-phase switch element SW2 which are opposite in enabled levels. When the first reverse-phase switch element SW1 is switched on, the first in-phase switch element SW2 is cut off, the first current source I1 can establish I1×R1 differential pressure with the threshold resistor R1; contrarily, the second current source I2 can establish I2×R1 differential pressure with the threshold resistor R1.

The capacitance charging and discharging circuit 2 is provided with the third current source I3, the fourth current source I4, the capacitor C1, as well as the second reverse-phase switch element SW3 and the second in-phase switch element SW4 which are opposite in enabled levels. When the second reverse-phase switch element SW3 is switched on, the second in-phase switch element SW4 is cut off, and the third current source I3 can charge the capacitor C1; and contrarily, the fourth current source I4 can discharge the capacitor C1.

Threshold voltage VR1 generated on the threshold resistor R1 by the comparator circuit 3 is compared with voltage VC1 of a charging and discharging node of the capacitor C1, control voltage Vout1 of power cord VDD end voltage or ground wire GND end voltage is output according to a comparative result, and the control voltage Vout1 is used to control voltage of a reference end of the threshold resistor R1 and voltage of a reference end of the capacitor C1 and to control conducting states of switches.

To further describe a working situation of the relaxation oscillating circuit of the invention, the working principle of the relaxation oscillating circuit is as follows:

It is contemplated that the capacitor C1 is not charged initially, and Vout1 is the ground wire GND voltage VGND. Firstly, the first reverse-phase switch element SW1 and the second reverse-phase switch element SW3 are switched on, the threshold voltage VR1 is established by the first current source I1, the capacitor C1 is charged by the third current source I3, and capacitor voltage VC1 rises. When the capacitor voltage VC1 exceeds the threshold voltage VR1, the control voltage Vout1 is turned into supply voltage VDD, the voltage of the reference ends of the resistor R1 and the capacitor C1 is turned into the supply voltage VDD to achieve bootstrap, by this time, the control voltage Vout1 is in a high level state, the first reverse-phase switch element SW1 and the second reverse-phase switch element SW3 are cut off when the control voltage Vout1 is at a high level, and the first in-phase switch element SW2, and the second in-phase switch element SW4 are switched on when the control voltage Vout1 is at the high level. By this time, the threshold voltage VR1 is established by the second current source I2, the capacitor voltage VC1 is bootstrapped, then turned into VR1 plus VDD, discharging is carried out by the fourth current source I4, and the capacitor voltage VC1 falls. When the capacitor voltage VC1 is lower than the threshold voltage VR1, the control voltage Vout1 output by a comparator is turned into the ground wire voltage VGND, the voltage of the reference ends of the resistor R1 and the capacitor C1 is turned into the ground wire voltage VGND to achieve bootstrap, by this time, the control voltage Vout1 is in a low level state, the first reverse-phase switch element SW1 and the second reverse-phase switch element SW3 are switched on when the control voltage Vout1 is at a low level, and the first in-phase switch element SW2 and the second in-phase switch element SW4 are cut off when the control voltage Vout1 is at the low level. And after the first reverse-phase switch element SW1 and the second reverse-phase switch element SW3 are switched on, the threshold voltage VR1 is established by the first current source I1, and the capacitor voltage VC1 is bootstrapped and then turned into VR1 minus VDD, and rises after being charged by the third current source I3.

It can be known from the described above that owing to an application of a bootstrap technique, the ranges of charging and discharging voltage are extended so that a same oscillating cycle can be realized with a smaller capacitor and resistor. Furthermore, after being charged, the capacitor discharges with existing charges, thereby increasing the current utilization rate. And if offset voltage of the comparator prolongs charging time, discharging time will be shortened as a result, so that the offset voltage of the comparator has lower influence on the frequency stability.

Embodiment 2 of the Relaxation Oscillator

Figure 2:
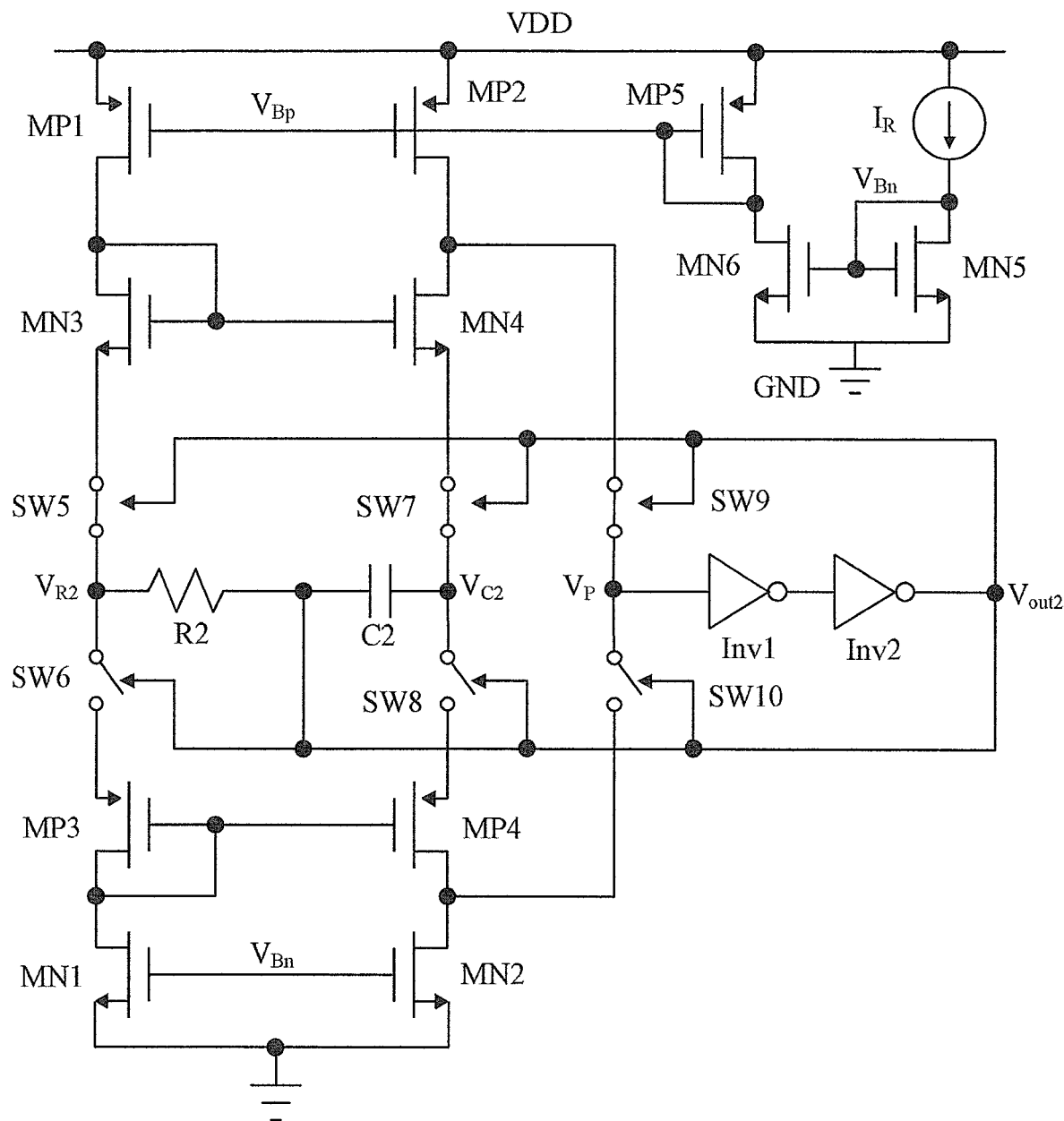
FIG. 2 is an electrical schematic diagram of Embodiment 2 of the relaxation oscillator of the invention.

As shown in FIG. 2, FIG. 2 is an electrical schematic diagram of another Embodiment of the relaxation oscillator of the invention. In this Embodiment. The relaxation oscillating circuit comprises a biasing circuit; the biasing circuit comprises a reference current source IR, a fifth NMOS transistor MN5, a sixth NMOS transistor MN6 and a fifth PMOS transistor MP5, wherein the reference current source IR is electrically connected with the power cord VDD; the reference current source IR is electrically connected with a drain electrode and a gate electrode of the fifth NMOS transistor MN5; the gate electrode of the fifth NMOS transistor MN5 is electrically connected with a gate electrode of the sixth NMOS transistor MN6; a drain electrode and a gate electrode of the fifth PMOS transistor MP5 are electrically connected with a drain electrode of the sixth NMOS transistor MN6. And the biasing circuit forms a mirror current source through the reference current source IR, the fifth NMOS transistor MN5, the sixth NMOS transistor MN6 and the fifth PMOS transistor MP5, and provides bias current for an oscillating circuit.

The gate electrode of the fifth PMOS transistor MP5 is electrically connected with a gate electrode of a first PMOS transistor MP1 and a gate electrode of a second PMOS transistor MP2 respectively, and a source electrode of the first PMOS transistor MP1 and a source electrode of the second PMOS transistor MP2 are electrically connected with the power cord VDD respectively, so that the biasing circuit and the first PMOS transistor MP1 form a current source for providing current for a resistor R2 in a charging process, and the biasing circuit and the second PMOS transistor MP2 form a current source for providing current for a capacitor C2 in the charging process. Furthermore, the gate electrode of the fifth NMOS transistor MN5 is electrically connected with a gate electrode of a first NMOS transistor MN1 and a gate electrode of a second NMOS transistor MN2 respectively. A source electrode of the first NMOS transistor MN1 is electrically connected with the ground wire GND, so that the biasing circuit and the first NMOS transistor MN1 form a current source for providing current for the resistor R2 in a discharging process; and a source electrode of the second NMOS transistor MN2 is electrically connected with the ground wire GND, so that the biasing circuit and the second NMOS transistor MN2 form a current source for providing current for the capacitor C2 in the discharging process.

In this Embodiment, the comparator circuit of the oscillating circuit comprises a current mode comparator circuit and a phase inverter circuit; the current mode comparator circuit transmits a voltage signal to the phase inverter circuit; wherein the current mode comparator circuit comprises a first current mode comparison circuit and a second current mode comparison circuit. The first current mode comparison circuit and the second current mode comparison circuit are electrically connected with a first input end and a second input end of the comparator circuit; in this Embodiment, the first input end of the comparator circuit inputs voltage VR2 to a reference end of the resistor R2; the second input end inputs voltage VC2 to a reference end of the capacitor C2; the first current mode comparison circuit is used for comparing voltage VR2 of the reference end of the resistor R2 and voltage VC2 of the reference end of the capacitor C2 in the charging process. and the second current mode comparison circuit is used for comparing voltage VR2 of the reference end of the resistor R2 and voltage VC2 of the reference end of the capacitor C2 in the discharging process. The first current mode comparison circuit comprises a current mode comparator consisting of a third NMOS transistor MN3 and a fourth NMOS transistor MN4; a gate electrode and a drain electrode of the third NMOS transistor MN3 are electrically connected with a gate electrode of the fourth NMOS transistor MN4; the drain electrode of the third NMOS transistor MN3 is electrically connected with a drain electrode of the first PMOS transistor MP1; a drain electrode of the fourth NMOS transistor MN4 is electrically connected with a drain electrode of the second PMOS transistor MP2; a source electrode of the third NMOS transistor MN3 is electrically connected with the resistor R2 through a switch element SW5; and a source electrode of the fourth NMOS transistor MN4 is electrically connected with the capacitor C2 through a switch element SW7. The second current mode comparison circuit comprises a current mode comparator consisting of a third PMOS transistor MP3 and a fourth PMOS transistor MP4; a gate electrode and a drain electrode of the third PMOS transistor MP3 are electrically connected with a gate electrode of the fourth PMOS transistor MP4; the drain electrode of the third PMOS transistor MP3 is electrically connected with a drain electrode of the first NMOS transistor MN1; a drain electrode of the fourth PMOS transistor MP4 is electrically connected with a drain electrode of the second NMOS transistor MN2; a source electrode of the third PMOS transistor MP3 is electrically connected with the resistor R2 through a switch element SW6; and a source electrode of the fourth PMOS transistor MP4 is electrically connected with the capacitor C2 through a switch element SW8.

The phase inverter circuit comprises a phase inverter Inv1 and a phase inverter Inv2; the phase inverter Inv1 is connected with the phase inverter Inv2 in series; an input end of the phase inverter Inv1 is electrically connected with the drain electrode of the fourth NMOS transistor MN4 through a switch element SW9; the input end of the phase inverter Inv1 is electrically connected with the drain electrode of the fourth PMOS transistor MP4 through a switch element SW10; after the voltage VR2 of the resistor R2 and the voltage VC2 of the capacitor C2 are compared by the first current mode comparison circuit or the second current mode comparison circuit, voltage VP is obtained; and the voltage VP is input to the phase inverter Inv1, quantized by the phase inverter Inv1, and then subjected to wave shaping by the phase inverter Inv2 to be obtain voltage Vout2. The phase inverter circuit is used in the comparator circuit because after the bootstrap technique is adopted, even if the phase inverters has unstable turn threshold voltage, only a duty ratio is affected, while the influence on the oscillating cycle is little, so that a situation that a comparator relatively high in power dissipation is used to eliminate offset voltage is avoided. Moreover, as simplest digital logic phase inverters are used to achieve generation of comparator and digital control logic, both the design complexity and the power dissipation are lowered, and at the same time, the comparator realized by the phase inverters automatically eliminate influence on the threshold voltage of the comparator by the offset voltage and temperature change in a working process and thus lowers the limitation to the frequency stability.

Furthermore, the switch element SW5, the switch element SW6, the switch element SW7, the switch element SW8, the switch element SW9 and the switch element SW10 are respectively fed with control signals by the output end of the phase inverter Inv2, and can control switch-on states of the switches according to the voltage Vout2 of the output end of the phase inverter Inv2. Wherein the switch element SW5, the switch element SW7 and the switch element SW9 are reverse-phase switch elements, and are cut off when the voltage Vout2 is at a high level and switched on when the voltage Vout2 is at a low level; the switch element SW6, the switch element SW8 and the switch element SW10 are in-phase switch elements, and are switched on when the voltage Vout2 is at the high level and cut off when the voltage Vout2 is at the low level. Thus, the oscillator is switched between the charging state and the discharging state at a fixed cycle. Meanwhile, a branch circuit between the resistor R2 and the capacitor C2 is electrically connected with the voltage Vout2 of the output end of the phase inverter Inv2, and the output voltage Vout2 is fed back to the branch circuit between the threshold resistor and the capacitor, so that the current utilization rate is increased.

Figure 3:
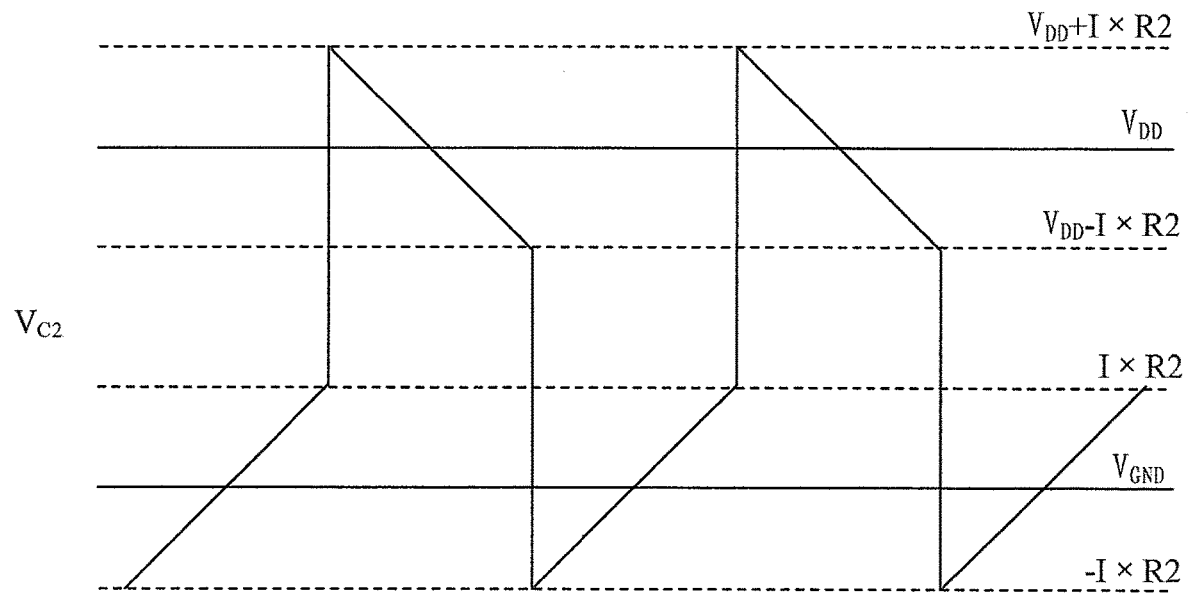
FIG. 3 is a voltage output wave diagram of voltage VC2 of a reference end of a capacitor C2 in Embodiment 2 of the relaxation oscillator of the invention.

To embody the advantages of the relaxation oscillator of the invention, refer to FIG. 3, a voltage wave diagram of voltage VC2 of the reference end of the capacitor C2 is shown. It is contemplated that all current provided by the current sources is equal to I. When the capacitor C2 is charged, the voltage of the reference end of the resistor R2 is VR2 which is equal to I×R2, after VC2 reaches VR2 as a result of charging the capacitor C2, the voltage of the reference end of capacitor C2 immediately lifts VDD due to the function of bootstrap, so VC2 is equal to VDD+I×R2, and subsequently the capacitor C2 is discharged; and when the capacitor C2 is discharged, the voltage of the reference end of the resistor R2 is VR2 which is equal to VDD−I×R2, after VC2 is equal to VDD−I×R2 as a result of discharging the capacitor C2, the voltage of the reference end of capacitor C2 immediately lowers VDD due to the function of bootstrap, so VC2 is equal to −I×R2, subsequently the capacitor C2 is charged, and the above processes are repeated. It thus can be known that VC2 has a variation of 2×I×R2 during charging the capacitor C2, and VC2 also has a variation of 2×I×R2 during discharging, as a result, the sum of the variations of VC2 is ΔV which is equal to 4×I×R2. According to a formula ΔV×C2=I×T, it can be obtained that 4×I×R2×C2=I×T, wherein T is an oscillating cycle and the oscillating cycle is equal to 4×R2×C2. And this computing method is certainly applicable to Embodiment 1.

It can be known from the above that the relaxation oscillator of the invention is simple in structure, few in module, low in power dissipation, and high in current utilization rate, so that the effects of shortening a development cycle, reducing a layout area of a circuit board and achieving super-low power dissipation are realized. Moreover, the first comparison circuit of the comparator circuit consists of in common-gate connection MOS transistors, so a voltage magnification effect is played; and the output voltage Vout2 is fed back to the branch circuit between the threshold resistor R2 and the capacitor C2, so that the current utilization rate is increased.

Embodiment 3 of the Relaxation Oscillator

Figure 4:
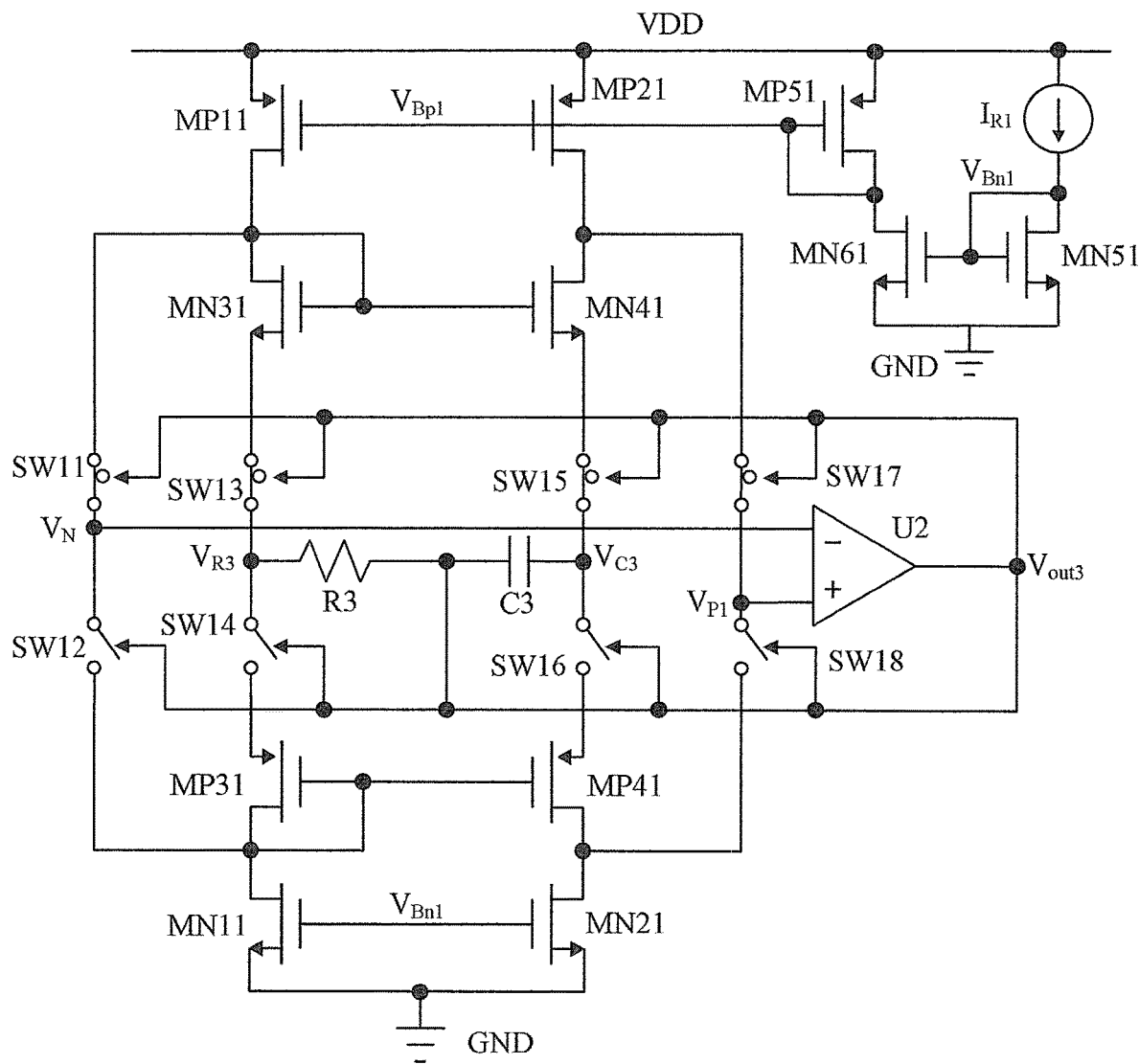
FIG. 4 is an electrical schematic diagram of Embodiment 3 of the relaxation oscillator of the invention.

Refer to FIG. 4, which is an electrical schematic diagram of Embodiment 3 of the relaxation oscillator of the invention.

In this Embodiment, the relaxation oscillating circuit comprises a biasing circuit; the biasing circuit comprises a reference current source IR1, an NMOS transistor MN51, an NMOS transistor MN61 and a PMOS transistor MP51, wherein the reference current source IR1 is electrically connected with the power cord VDD; the reference current source IR1 is electrically connected with a drain electrode and a gate electrode of the NMOS transistor MN51; the gate electrode of the NMOS transistor MN51 is electrically connected with a gate electrode of the NMOS transistor MN61; a drain electrode and a gate electrode of the PMOS transistor MP51 are electrically connected with a drain electrode of the NMOS transistor MN61. And the biasing circuit forms a mirror current source through the reference current source IR1, the NMOS transistor MN51, the NMOS transistor MN61 and the PMOS transistor MP51, and provides bias current for an oscillating circuit.

The gate electrode of the PMOS transistor MP51 are electrically connected with a gate electrode of a PMOS transistor MP11 and a gate electrode of a PMOS transistor MP21 respectively, and a source electrode of the PMOS transistor MP11 and a source electrode of the PMOS transistor MP21 are electrically connected with the power cord VDD respectively, so that the biasing circuit and the PMOS transistor MP11 form a current source for providing current for a resistor R3 in a charging process, and the biasing circuit and the PMOS transistor MP21 form a current source for providing current for a capacitor C3 in the charging process. Furthermore, the gate electrode of the NMOS transistor MN51 is electrically connected with a gate electrode of an NMOS transistor MN11 and a gate electrode of an NMOS transistor MN21 respectively; a source electrode of the NMOS transistor MN11 is electrically connected with the ground wire GND, so that the biasing circuit and the NMOS transistor MN11 form a current source for providing current for the resistor R3 in a discharging process; and a source electrode of the NMOS transistor MN21 is electrically connected with the ground wire GND, so that the biasing circuit and the NMOS transistor MN21 form a current source for providing current for the capacitor C3 in the discharging process.

In this Embodiment, the comparator circuit of the oscillating circuit comprises a current mode comparator circuit and a voltage comparison circuit; wherein the current mode comparator circuit comprises a first current mode comparison circuit and a second current mode comparison circuit. The first current mode comparison circuit is used for comparing voltage VR3 of a reference end of the resistor R3 and voltage VC3 of a reference end of the capacitor C3 in a charging process; and the second current mode comparison circuit is used for comparing voltage VR3 of the reference end of the resistor R3 and voltage VC3 of the reference end of the capacitor C3 in a discharging process. The first current mode comparison circuit comprises a current mode comparator consisting of an NMOS transistor MN31 and an NMOS transistor MN41; a gate electrode and a drain electrode of the NMOS transistor MN31 are electrically connected with a gate electrode of the NMOS transistor MN41; the drain electrode of the NMOS transistor MN31 is electrically connected with a drain electrode of the PMOS transistor MP11; a drain electrode of the NMOS transistor MN41 is electrically connected with a drain electrode of the PMOS transistor MP21; a source electrode of the NMOS transistor MN31 is electrically connected with the resistor R3 through a switch element SW13; and a source electrode of the NMOS transistor MN41 is electrically connected with the capacitor C3 through a switch element SW15. The second current mode comparison circuit comprises a current mode comparator consisting of a PMOS transistor MP31 and a PMOS transistor MP41; a gate electrode and a drain electrode of the PMOS transistor MP31 are electrically connected with a gate electrode of the PMOS transistor MP41; the drain electrode of the PMOS transistor MP31 is electrically connected with a drain electrode of the NMOS transistor MN11; a drain electrode of the PMOS transistor MP41 is electrically connected with a drain electrode of the NMOS transistor MN21; a source electrode of the PMOS transistor MP31 is electrically connected with the resistor R3 through a switch element SW14; and a source electrode of the PMOS transistor MP41 is electrically connected with the capacitor C3 through a switch element SW16.

A reverse-phase input end of the voltage comparison circuit U2 is electrically connected with the drain electrode of the NMOS transistor MN31 through a switch element SW11; the reverse-phase input end of the voltage comparison circuit U2 is electrically connected with the drain electrode of the PMOS transistor MP31 through a switch element SW12. An in-phase input end of the voltage comparison circuit U2 is electrically connected with the drain electrode of the NMOS transistor MN41 through a switch element SW17; the in-phase input end of the voltage comparison circuit U2 is electrically connected with the drain electrode of the PMOS transistor MP41 through a switch element SW18. And an output end of the voltage comparison circuit U2 provides control signals for the switch element SW11, the switch element SW12, the switch element SW13, the switch element SW14, the switch element SW15, the switch element SW16, the switch element SW17 and the switch element SW18 respectively, wherein the switch element SW11, the switch element SW13, the switch element SW15 and the switch element SW17 are reverse-phase switch elements, and the switch element SW12, the switch element SW14, the switch element SW16 and the switch element SW18 are in-phase switch element.

The first current mode comparison circuit or the second current mode comparison circuit outputs a first voltage signal to the reverse-phase input end of the voltage comparison circuit U2, and the first current mode comparison circuit or the second current mode comparison circuit outputs a second voltage signal to the in-phase input end of the voltage comparison circuit U2. After the voltage VR3 of the resistor R3 and the voltage VC3 of the capacitor C3 are compared by the first current mode comparison circuit or the second current mode comparison circuit, voltage VN is output at the drain electrode of the NMOS transistor MN31 or the drain electrode of the PMOS transistor MP31, and voltage VP1 is output at the drain electrode of the NMOS transistor MN41 or the drain electrode of the PMOS transistor MP41. The voltage VN is input to the reverse-phase input end of the voltage comparison circuit U2, the voltage VP1 is input to the in-phase input end of the voltage comparison circuit U2, and output voltage Vout3 is obtained at the output end of the voltage comparison circuit U2. The switch element SW17, the switch element SW18, switch element SW11 and the switch element SW12 can control switch-on states of the switches according the output voltage Vout3 of the output end of the voltage comparison circuit U2. Wherein the switch element SW17 and the switch element SW11 are cut off when the voltage Vout3 is at a high level and switched on when the voltage Vout2 is at a low level; and the switch element SW18 and the switch element SW12 are cut off when the voltage Vout3 is at the low level and switched on when the voltage Vout3 is at the high level.

When being used in the monolithic integrated chip, the relaxation oscillator of the invention can provide a clock signal at stable frequency for a clock using circuit in the monolithic integrated chip, wherein the clock using circuit is a circuit necessarily initiated by the clock signal, such as a digital circuit under sequential control. In addition, this oscillator is simple in structure, few in module, low in power dissipation and high in current utilization rate, resulting in that the monolithic integrated chip can realize high frequency stability and low power dissipation.

It should be stated that the Embodiments above are only preferred Embodiments of the invention, but the inventive concept is not so limited. Any insubstantial modification made to the invention based on this concept falls into the protection scope of the invention.

INDUSTRIAL APPLICABILITY

The comparator of the invention takes the MOS transistors which are in common-gate connection as the current mode comparison circuits, so that the voltage amplification effect is proved without consuming extra power dissipation, and the circuit performance is improved. The comparator of the invention uses the simplest digital logic phase inverters to achieve comparator and generation of digital control logic, so that the design complexity and the power dissipation are lowered simultaneously. Moreover, with the cooperation of the current mode comparator and the phase inverters in use, the comparator can automatically eliminate influence from offset voltage and temperature change in a working process. The relaxation oscillator of the invention feeds back output voltage of the comparator to the branch circuit between the threshold resistor and the capacitor, leading to that the voltage ranges of capacitor charging and discharging are extended; and after being charged, the capacitor discharges with existing charges, thereby increasing the current utilization rate.

The invention claimed is:

1. A comparator, comprising a comparator circuit, wherein the comparator circuit comprises a current mode comparator circuit, wherein the current mode comparator circuit comprises a first current mode comparison circuit and a second current mode comparison circuit, and both the first current mode comparison circuit and the second current mode comparison circuit are electrically connected with a first input end and a second input end of the comparator circuit; and the first current mode comparison circuit comprises two N-type MOS transistors, gate electrodes of the two N-type MOS transistors are electrically connected with each other, the second current mode comparison circuit comprises two P-type MOS transistors, and gate electrodes of the two P-type MOS transistors are electrically connected with each other;

wherein the comparator circuit further comprises a voltage comparison circuit, the first current mode comparison circuit or the second current mode comparison circuit outputs a first voltage signal to a reverse-phase input end of the voltage comparison circuit, and the first current mode comparison circuit or the second current mode comparison circuit outputs a second voltage signal to an in-phase input end of the voltage comparison circuit.

2. The comparator of claim 1, wherein the comparator circuit further comprises a phase inverter circuit, and the current mode comparator circuit transmit voltage signals to the phase inverter circuit;

the phase inverter circuit comprises a first phase inverter and a second phase inverter, and the first phase inverter is connected with the second phase inverter in series; and an output end of the first current mode comparison circuit and an output end of the second current mode comparison circuit are electrically connected with an input end of the first phase inverter, respectively.

3. A relaxation oscillator, comprising a relaxation oscillating circuit, wherein the relaxation oscillating circuit comprises a comparator, and the comparator comprises a comparator circuit; wherein the comparator circuit comprises a current mode comparator circuit, the current mode comparator circuit comprises a first current mode comparison circuit and a second current mode comparison circuit, and both the first current mode comparison circuit and the second current mode comparison circuit are electrically connected with a first input end and a second input end of the comparator circuit; and the first current mode comparison circuit comprises two N-type MOS transistors, gate electrodes of the two N-type MOS transistors are electrically connected with each other, the second current mode comparison circuit comprises two P-type MOS transistors, and gate electrodes of the two P-type MOS transistors are electrically connected with each other;

wherein the comparator circuit further comprises a voltage comparison circuit, the first current mode comparison circuit or the second current mode comparison circuit outputs a first voltage signal to a reverse-phase input end of the voltage comparison circuit, and the first current mode comparison circuit or the second current mode comparison circuit outputs a second voltage signal to an in-phase input end of the voltage comparison circuit.

4. The relaxation oscillator of claim 3, wherein the comparator circuit further comprises a phase inverter circuit, and the current mode comparator circuits transmit voltage signals to the phase inverter circuit;

the phase inverter circuit comprises a first phase inverter and a second phase inverter, and the first phase inverter is connected with the second phase inverter in series; and an output end of the first current mode comparison circuit and an output end of the second current mode comparison circuit are electrically connected with an input end of the first phase inverter, respectively.

5. The relaxation oscillator of claim 3, wherein the relaxation oscillating circuit further comprises a threshold voltage generation circuit and a capacitance charging and discharging circuit, the threshold voltage generation circuit inputs a threshold voltage signal to the first input end of the comparator circuit, and the capacitance charging and discharging circuit inputs a capacitance voltage signal to the second input end of the comparator circuit.

6. The relaxation oscillator of claim 5, wherein the threshold voltage generation circuit comprises a first current source, a second current source and a threshold resistor, wherein the first current source is electrically connected with the threshold resistor through a first switch element, and the second current source is electrically connected with the threshold resistor through a second switch element; and the capacitance charging and discharging circuit comprises a third current source, a fourth current source and a capacitor, wherein the third current source is electrically connected with the capacitor through a third switch element, and the fourth current source is electrically connected with the capacitor through a fourth switch element.

7. The relaxation oscillator of claim 6, wherein the first switch element, the second switch element, the third switch element and the fourth switch element are electrically connected with an output end of the comparator circuit, respectively;

the output end of the comparator circuit is electrically connected with a branch circuit between the threshold resistor and the capacitor; and the first current source and the third current source are electrically connected with a power cord, respectively, and the second current source and the fourth current source are electrically connected with a ground wire, respectively.

8. The relaxation oscillator of claim 7, wherein the first current source, the second current source, the third current source and the fourth current source are each provided with one MOS transistor, the MOS transistor of the first current source is in common-gate connection with the MOS transistor of the third current source, and the MOS transistor of the second current source is in common-gate connection with the MOS transistor of the fourth current source.

* * * * *